United States Patent
Chen et al.

(10) Patent No.: US 9,617,476 B2
(45) Date of Patent: Apr. 11, 2017

(54) LIQUID CRYSTAL COMPOSITION

(71) Applicant: HUIZHOU FORYOU OPTICAL TECHNOLOGY CO., LTD., Huizhou, Guangdong Province (CN)

(72) Inventors: Zhangrong Chen, Huizhou (CN); Desheng Song, Huizhou (CN); Wendi Liu, Huizhou (CN)

(73) Assignee: HUIZHOU FORYOU OPTICAL TECHNOLOGY CO., LTD., Huizhou, Guangdong Province (CN)

( * ) Notice: Subject to any disclaimer, the term of this patent is extended or adjusted under 35 U.S.C. 154(b) by 0 days.

(21) Appl. No.: 14/654,821

(22) PCT Filed: Jun. 17, 2014

(86) PCT No.: PCT/CN2014/080100
§ 371 (c)(1),
(2) Date: Jun. 22, 2015

(87) PCT Pub. No.: WO2014/201997
PCT Pub. Date: Dec. 24, 2014

(65) Prior Publication Data
US 2015/0344781 A1    Dec. 3, 2015

(30) Foreign Application Priority Data

Jun. 21, 2013 (CN) .......................... 2013 1 0251650

(51) Int. Cl.
| | |
|---|---|
| G02F 1/1333 | (2006.01) |
| C09K 19/38 | (2006.01) |
| C09K 19/58 | (2006.01) |
| C09K 19/06 | (2006.01) |
| C09K 19/32 | (2006.01) |
| C09K 19/36 | (2006.01) |
| G03F 7/004 | (2006.01) |
| G03F 7/027 | (2006.01) |
| C09D 11/101 | (2014.01) |
| C09K 19/04 | (2006.01) |
| C09K 19/12 | (2006.01) |
| C09K 19/30 | (2006.01) |
| C09K 19/34 | (2006.01) |

(52) U.S. Cl.
CPC ........ *C09K 19/3809* (2013.01); *C09D 11/101* (2013.01); *C09K 19/062* (2013.01); *C09K 19/322* (2013.01); *C09K 19/36* (2013.01); *C09K 19/586* (2013.01); *C09K 19/588* (2013.01); *G03F 7/004* (2013.01); *G03F 7/027* (2013.01); *C09K 2019/0448* (2013.01); *C09K 2019/122* (2013.01); *C09K 2019/3004* (2013.01); *C09K 2019/3009* (2013.01); *C09K 2019/3408* (2013.01)

(58) Field of Classification Search
CPC .............. C09K 19/3809; C09K 19/588; C09K 19/062; C09K 19/322; C09K 19/36; C09K 19/586; C09K 2019/0448; C09K 2019/122; C09K 2019/3004; C09K 2019/3009; C09K 2019/3408; G03F 7/004; G03F 7/027; C09D 11/101; G02F 1/1333
USPC .............. 252/299.01, 299.6, 299.64; 428/1.1
See application file for complete search history.

(56) References Cited

U.S. PATENT DOCUMENTS

| | | | |
|---|---|---|---|
| 5,780,629 A | 7/1998 | Etzbach et al. | |
| 5,886,242 A | 3/1999 | Etzbach et al. | |
| 6,217,792 B1 | 4/2001 | Parri et al. | |
| 2011/0255073 A1 | 10/2011 | Brill et al. | |

FOREIGN PATENT DOCUMENTS

| | | | |
|---|---|---|---|
| CN | 1141645 A | 1/1997 | |
| CN | 1223657 A | 7/1999 | |
| JP | P2004-99861 A | * 4/2004 | ............. C09K 19/54 |

* cited by examiner

*Primary Examiner* — Geraldina Visconti
(74) *Attorney, Agent, or Firm* — Cheng-Ju Chiang

(57) ABSTRACT

The present disclosure discloses a liquid crystal composition. The liquid crystal composition includes the following components in their respective mass percentages: 8%-50% of a polymerizable liquid crystal monomer; 1%-30% of a chiral reagent; 0.1%-5% of a photoinitiator; and 30%-70% of an organic solvent, wherein the liquid crystal composition after being cured exhibits visual angle dependent optical effect. In this way, the liquid crystal composition of the present disclosure includes no pigment particles or liquid crystal microcapsules, can be UV cured into film, and is applicable to being printed onto various substrates through gravure or flexo printing, so that it has a promising application prospect.

13 Claims, No Drawings

LIQUID CRYSTAL COMPOSITION

CROSS REFERENCE TO RELATED APPLICATIONS

The present application is a 35 U.S.C. §371 National Phase conversion of International (PCT) Patent Application No. PCT/CN2014/080100, filed on Jun. 17, 2014, which claims the benefit of Chinese Application No. 201310251650.9, filed on Jun. 21, 2013, the disclosure of which is incorporated by reference herein. The PCT International Patent Application was filed and published in Chinese.

FIELD OF THE INVENTION

The present disclosure relates to the technical field of liquid crystal materials, and more particularly, to a liquid crystal composition.

BACKGROUND OF THE INVENTION

Liquid crystal is physically anisotropic. It is a transitional intermediate phase material having part of properties of both the crystal and the liquid, and plays an important role in many fields including biomedicine, electro-communication, aviation and navigation. In such macromolecules, a cholesteric phase liquid crystal monomer with a spiral structure is especially striking because it has excellent optical properties and can be used in novel optical materials, electronic and absorbing materials, so it has a promising application prospect.

However, from the point of view of the development of existing technologies, the cholesteric phase liquid crystal monomer is mainly applied to optical films and liquid crystal pigments. Thus, it is especially important to study and develop the application methods of such material so that they can afford higher social and economic benefits.

SUMMARY OF THE INVENTION

The main technical problem to be solved by the present disclosure is to provide a liquid crystal composition. This composition comprises no pigment particles or liquid crystal microcapsules, can be UV cured into a film, and is applicable to being printed onto various substrates through gravure or flexo printing, so that it has a promising application prospect.

To solve the aforesaid technical problem, a technical solution adopted by the present disclosure is: to provide a liquid crystal composition, comprising the following components in their respective mass percentages: 8%-50% of a polymerizable liquid crystal monomer; 1%-30% of a chiral reagent; 0.1%-5% of a photoinitiator; and 30%-70% of an organic solvent, wherein the liquid crystal composition after being cured exhibits visual angle dependent optical effect.

Specifically, the liquid crystal composition comprises the following components in their respective mass percentages: 30%-40% of a polymerizable liquid crystal monomer; 1%-8% of a chiral reagent; 0.1%-0.8% of a photoinitiator; and 50%-70% of an organic solvent.

Specifically, the polymerizable liquid crystal monomer comprises at least one of mono-functional liquid crystal monomers and bi-functional liquid crystal monomers; the chiral reagent is at least one of acrylates, methacrylates, epoxy reins, methyl epoxy resins and alkenes containing with chiral centers, cholesterol, menthol and isosorbitol chiral groups; and the photoinitiator is at least one of a free radical initiator and a cationic initiator.

Specifically, the structural formula of the mono-functional liquid crystal monomer is P-Sp-X-M-R, wherein P is arbitrarily selected from one of $CH_2=CW-COO-$, $WCH=CH-O-$, and

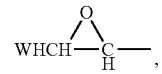

W is arbitrarily selected from one of H, $-CH_3$ and Cl, Sp is arbitrarily selected from one of spacer groups with a chain length of 3-30 carbon atoms, X is arbitrarily selected from one of $-O-$, $-S-$, $-CO-$, $-COO-$, $-OCO-$, $-CO-NH-$, $-NH-CO-$, $-CH_2CH_2-$, $-OCH_2-$, $-CH_2O-$, $-SCH_2-$, $-CH_2S-$, $-CH=CH-$ and $-CH=CH-COO-$, M is a mesogenic group, and R is arbitrarily selected from H, CN, Cl, alkoxy, straight-chain alkanes, branched alkanes and cycloalkanes; wherein the structural formula of the mesogenic group M is $-A^1-Z^1-(A^2-Z^2-)_mA^3-$, $Z^1$ and $Z^2$ are each independently selected from one of $-COO-$, $-OCO-$, $-CH_2CH_2-$, $-OCH_2-$, $-CH_2O-$, $-CH=CH-$, $-CH=CH-COO-$, $-OCO-CH=CH-$ and $-C\equiv C-$, m is 0, 1, or 2, $A^1$, $A^2$, and $A^3$ are each independently selected from one of

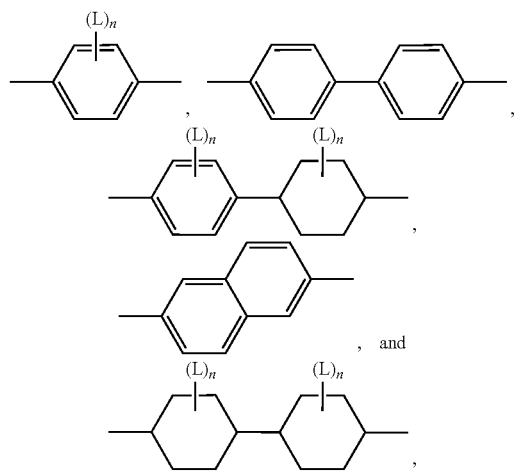

L is arbitrarily selected from one of H, F, Cl, CN, OH, $NO_2$, $CH_3$, $C_2H_5$, $OCH_3$, $OC_2H_5$, $COCH_3$, $COOCH_3$, $COOC_2H_5$, $CF_3$, $OCF_2$, and $OC_2F_5$, and n is 0, 1, or 2.

Specifically, the structural formula of the bi-functional liquid crystal monomer is $P^1-Sp^1-X^1-Y-X^2-Sp^2-P^2$, wherein $P^1$ and $P^2$ are arbitrarily selected from one of $CH_2=CW-COO-$, $WCH=CH-O-$, and

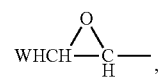

W is arbitrarily selected from one of H, $-CH_3$ and Cl, $Sp^1$ and $Sp^2$ are arbitrarily selected from one of spacer groups with a chain length of 3-30 carbon atoms, $X^1$ and $X^2$ are each arbitrarily selected from one of $-O-$, $-S-$, $-CO-$, $-COO-$, $-OCO-$, $-CO-NH-$, $-NH-CO-$, —$CH_2CH_2$—, —$OCH_2$—, —$CH_2O$—, —$SCH_2$—, —$CH_2S$—, —CH=CH— and —CH=CH—COO—, Y is a mesogenic group, the structural formula of the mesogenic group Y is -$A^4$-$Z^3$-$(A^5$-$Z^4)_m$-$A^6$-, $Z^3$ and $Z^4$ are each independently selected from one of —COO—, —OCO—, —$CH_2CH_2$—, —$OCH_2$—, —$CH_2O$—, —CH=CH—, —CH=CH—COO—, —OCO—CH=CH— and —C≡C—, m is 0, 1, or 2, $A^4$, $A^5$, and $A^6$ are each independently selected from one of

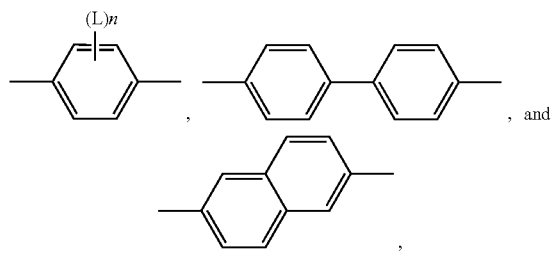

L is arbitrarily selected from one of H, F, Cl, CN, OH, $NO_2$, $CH_3$, $C_2H_5$, $OCH_3$, $OC_2H_5$, $COCH_3$, $COOCH_3$, $COOC_2H_5$, $CF_3$, $OCF_2$, and $OC_2F_5$, and n is 0, 1, or 2.

Specifically, the structure formula of the chiral reagent is $P^3$-$Sp^3$-$X^3$-G-$X^4$-$Sp^4$-$P^4$ or $P^5$-$Sp^5$-$X^5$—F, wherein $P^3$ and $P^4$ are each independently selected from one of $CH_2$=CW—COO—, WCH=CH—O— and

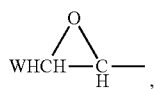

W is arbitrarily selected from one of H, —$CH_3$ and Cl, $Sp^3$ and $Sp^4$ are each arbitrarily selected from one of spacer groups with a chain length of 3-30 carbon atoms, $X^3$ and $X^4$ are each independently selected from one of —O—, —S—, —CO—, —COO—, —OCO—, —CO—NH—, —NH—CO—, —$CH_2CH_2$—, —$OCH_2$—, —$CH_2O$—, —$SCH_2$—, —$CH_2S$—, —CH=CH—, and —CH=CH—COO—, G is arbitrarily selected from one of

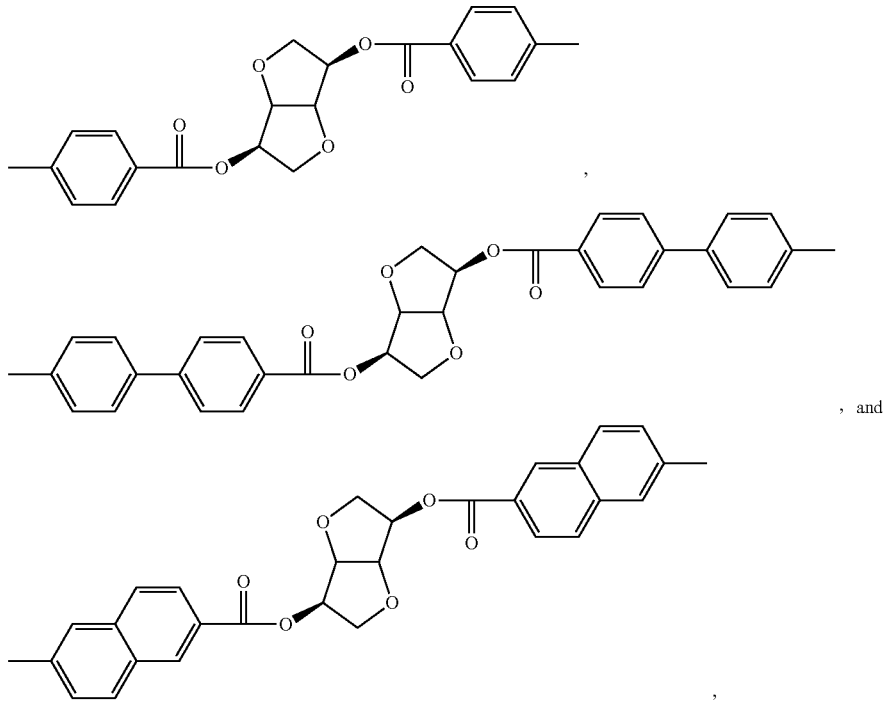

$P^5$ is arbitrarily selected from one of $CH_2$=CW—COO—, WCH=CH—O— and

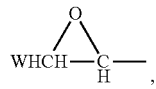

W is arbitrarily selected from one of H, —$CH_3$ and Cl, $Sp^5$ is arbitrarily selected from one of spacer groups with a chain length of 3-30 carbon atoms, $X^5$ is arbitrarily selected from one of —COO— and CH=CH—COO—, and F is arbitrarily selected from one of

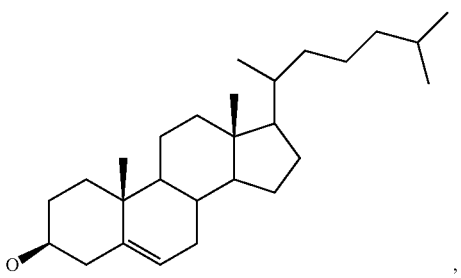

Specifically, the mono-functional liquid crystal monomer is at least one of
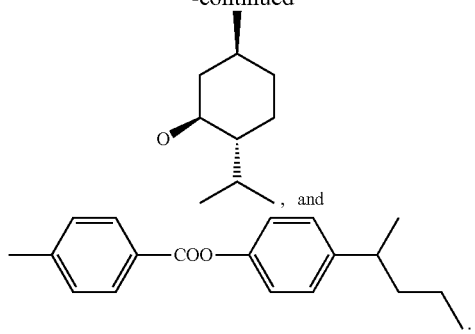
Specifically, the bi-functional liquid crystal monomer is at least one of
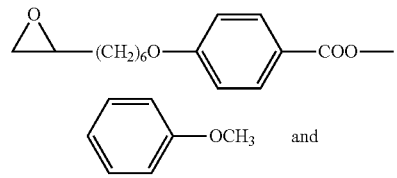
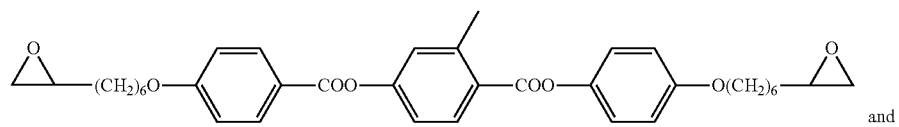
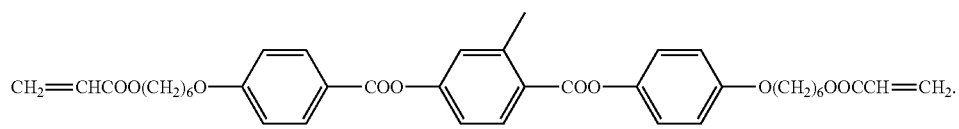
Specifically, the chiral reagent is at least one of
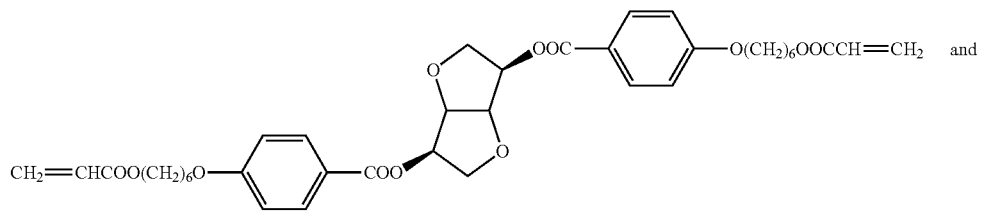
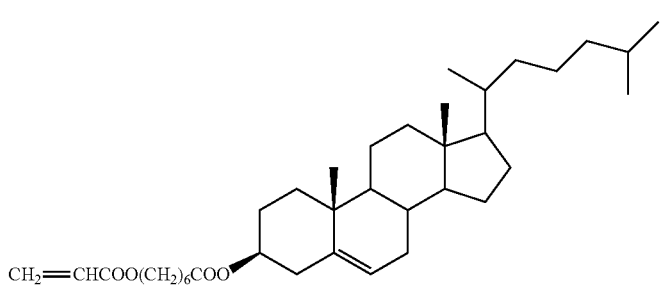

Specifically, the composition further comprises 0.1%-1% of an antioxidant and 0.01%-0.1% of an assistant, wherein the antioxidant is any one of hydroquinone, methoxyhydroquinone, benzoquinone, mono-tert-butylhydroquinone, pyrocatechol, p-tert-butylpyrocatechol, benzoquinone, 2,5-di-tert-butylhydroquinone, 2,5-dimethyl-p-benzoquinone, anthraquinone, and 2,6-di-tert-butyl-p-cresol; and the assistant is at least one of a fluorocarbon surfactant or an organosilicon surfactant.

Specifically, the composition further comprises 0.1%-1% of a tackifier which is at least one of the monomers, oligomers and prepolymers of acrylates, methacrylates, and epoxy acrylates having polymerizable groups.

Specifically, the photoinitiator is at least one of dimethoxybenzoin, 1-hydroxyketone, BDMB, phenyl bis(2,4,6-trimethylbenzoyl)-phosphine oxide, diazonium salt, diaryliodonium salt, triarylsulfonium salt, alkyl sulfonium salt, iron arene salt, sulfonyloxyketone, and triarylsiloxane.

Specifically, the organic solvent is at least one of toluene, xylene, ethylene glycol monomethylether, propylene glycol monomethyl ether, ethyl acetate, n-butyl acetate, n-propyl acetate, isobutyl acetate, amyl acetate, butanone, methyl isobutyl ketone, and isophorone.

The benefits of the present disclosure are as follows: as compared to the prior art, the present disclosure provides a liquid crystal composition comprising a polymerizable liquid crystal monomer, a chiral reagent, a photoinitiator and a solvent. The liquid crystal composition of the present disclosure contains no pigment particles or liquid crystal microcapsules, and after being cured exhibits visual angle dependent optical effect. Because the liquid crystal composition of the present disclosure contains no pigment particles, it is free of the phenomenon of coloring and poor discoloration effect as a result of arrangement of pigment pieces. Further, the composition contains no liquid crystal microcapsules, so after being UV cured into a film, it does not change as the external conditions (such as temperature, magnetic field and pressure) change. Thus, the liquid crystal composition of the present disclosure has excellent properties.

Additionally, the liquid crystal composition provided by the present disclosure can be used as an oil ink, a colorant or the like and can be printed onto various substrates such as glass, stainless steel, iron sheet, copper printing paper and plastics through gravure or flexo printing, so that it has a promising application prospect.

DETAILED DESCRIPTION OF THE INVENTION

The present disclosure is to be further described in conjunction with specific embodiments, but the present disclosure is not limited to the illustrated specific embodiments.

The liquid crystal composition of the present disclosure comprises a polymerizable liquid crystal monomer, a chiral reagent, a photoinitiator and an organic solvent, wherein the mass percentages of the components are as follows: 8%-50% of the polymerizable liquid crystal monomer; 1%-30% of the chiral reagent; 0.1%-5% of the photoinitiator; and 30%-70% of the organic solvent, wherein the liquid crystal composition of the present disclosure after being cured exhibits visual angle dependent optical effect.

In one embodiment, the mass percentages of the components are: 30%-40% of the polymerizable liquid crystal monomer; 1%-8% of the chiral reagent; 0.1%48% of the photoinitiator; and 50%-70% of the organic solvent.

Specifically, the polymerizable liquid crystal monomer may be at least one of mono-functional liquid crystal monomers and bi-functional liquid crystal monomers. In one embodiment, the liquid crystal monomer comprises 20%-30% of mono-functional liquid crystal monomers and 8-20% of bi-functional liquid crystal monomers.

Specifically, in the embodiments of the present disclosure, the structural formula of the mono-functional liquid crystal monomer is P-Sp-X-M-R, wherein P is arbitrarily selected from one of $CH_2=CW-COO-$, $WCH=CH-O-$, and

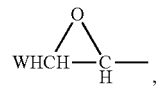

W is arbitrarily selected from one of H, $-CH_3$ and Cl, Sp is arbitrarily selected from one of spacer groups with a chain length of 3-30 carbon atoms, X is arbitrarily selected from one of $-O-$, $-S-$, $-CO-$, $-COO-$, $-OCO-$, $-CO-NH-$, $-NH-CO-$, $-CH_2CH_2-$, $-OCH_2-$, $-CH_2O-$, $-SCH_2-$, $-CH_2S-$, $-CH=CH-$ and $-CH=CH-COO-$, M is a mesogenic group, and R is arbitrarily selected from H, CN, Cl, alkoxyl, straight-chain alkanes, branched alkanes and cycloalkanes; wherein the structural formula of the mesogenic group M is $-A^1-Z^1-(A^2-Z^2-)_m-A^3-$, $Z^1$ and $Z^2$ are each independently selected from one of $-COO-$, $-OCO-$, $-CH_2CH_2-$, $-OCH_2-$, $-CH_2O-$, $-CH=CH-$, $-CH=CH-COO-$, $-OCO-CH=CH-$ and $-C\equiv C-$, m is 0, 1, or 2, $A^1$, $A^2$, and $A^3$ are each independently selected from one of

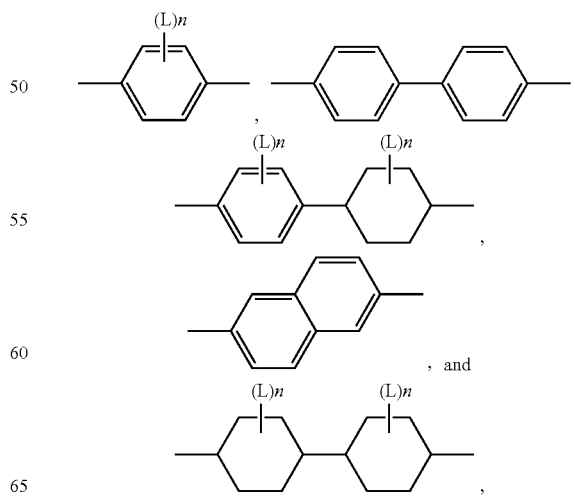

L is arbitrarily selected from one of H, F, Cl, CN, OH, NO$_2$, CH$_3$, C$_2$H$_5$, OCH$_3$, OC$_2$H$_5$, COCH$_3$, COOCH$_3$, COOC$_2$H$_5$, CF$_3$, OCF$_2$, and OC$_2$F$_5$, and n is 0, 1, or 2.

Specifically, the mono-functional liquid crystal monomer may be selected from at least one of

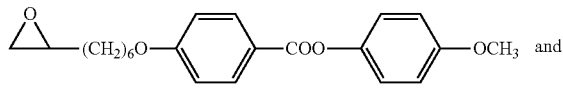

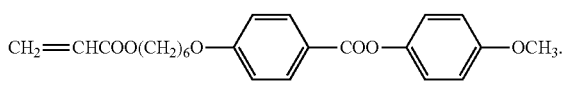

Specifically, in the embodiments of the present disclosure, the structural formula of the bi-functional liquid crystal monomer is: P$^1$-Sp$^1$-X$^1$—Y—X$^2$-Sp$^2$-P$^2$, wherein P$^1$ and P$^2$ are arbitrarily selected from one of —CH$_2$=CH—COO—, WCH=CH—O—, and

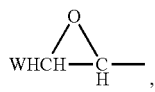

W is arbitrarily selected from one of H, —CH$_3$ and Cl, Sp$^1$ and Sp$^2$ are arbitrarily selected from one of spacer groups with a chain length of 3-30 carbon atoms, X$^1$ and X$^2$ are each arbitrarily selected from one of —O—, —S—, —CO—, —COO—, —OCO—, —CO—NH—, —NH—CO—, —CH$_2$CH$_2$—, —OCH$_2$—, —CH$_2$O—, —SCH$_2$—, —CH$_2$S—, —CH=CH— and —CH=CH—COO—, Y is a mesogenic group, the structural formula of the mesogenic group Y is -A$^4$-Z$^3$-(A$^5$-Z$^4$)$_m$-A$^6$-, Z$^3$ and Z$^4$ are each independently selected from one of —COO—, —OCO—, —CH$_2$CH$_2$—, —OCH$_2$—, —CH$_2$O—, —CH=CH—, —CH=CH—COO—, —OCO—CH=CH— and —C≡C—, m is 0, 1, or 2, A$^4$, A$^5$, and A$^6$ are each independently selected from one of

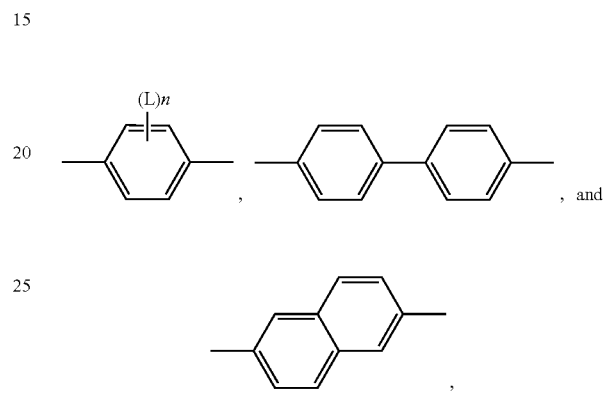

L is arbitrarily selected from one of H, F, Cl, CN, OH, NO$_2$, CH$_3$, C$_2$H$_5$, OCH$_3$, OC$_2$H$_5$, COCH$_3$, COOCH$_3$, COOC$_2$H$_5$, CF$_3$, OCF$_2$, and OC$_2$F$_5$, and n is 0, 1, or 2.

Specifically, the bi-functional liquid crystal monomer may be selected from at least one of

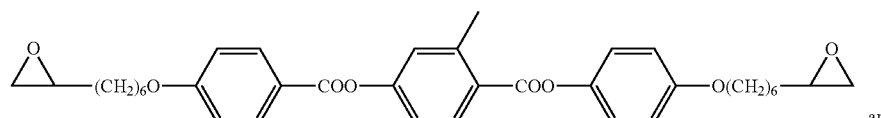

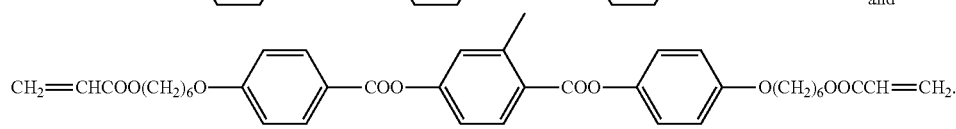

In the embodiments of the present disclosure, the chiral reagent may be polymerizable chiral reagents, for example at least one of acrylates, methacrylates, epoxy reins, methyl epoxy resins and alkenes containing cholesterol, menthol and isosorbitol chiral groups or chiral centers.

The structural formula of the chiral reagent is: —P$^3$-Sp$^3$-X$^3$-G-X$^4$-Sp$^4$-P$^4$ or P$^5$-Sp$^5$-X$^5$—F, wherein P$^3$ and P$^4$ are each independently selected from one of CH$_2$=CW—COO—, WCH=CH—O— and

W is arbitrarily selected from one of H, —CH$_3$ and Cl, Sp$^3$ and Sp$^4$ are each arbitrarily selected from one of spacer groups with a chain length of 3-30 carbon atoms, X$^3$ and X$^4$ are each independently selected from one of —O—, —S—, —CO—, —COO—, —OCO—, —CO—NH—, —NH—CO—, —CH$_2$CH$_2$—, —OCH$_2$—, —CH$_2$O—, —SCH$_2$—, —CH$_2$S—, —CH=CH— and —CH=CH—COO—, G is arbitrarily selected from one of

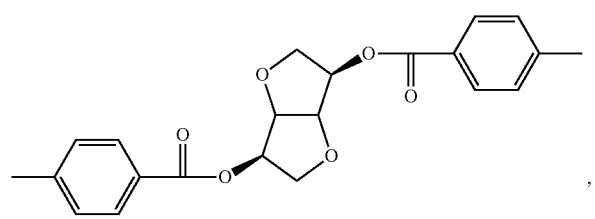
,

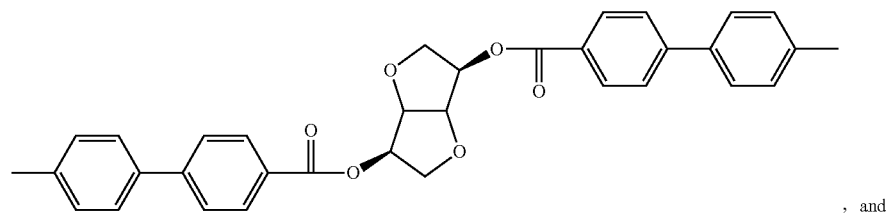
, and

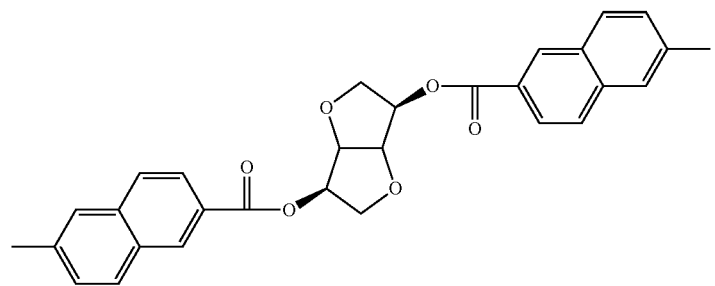
,

P$^5$ is arbitrarily selected from one of CH$_2$=CW—COO—, WCH=CH—O— and

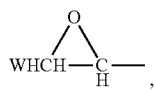
,

W is arbitrarily selected from one of H, —CH$_3$ and Cl, Sp$^5$ is arbitrarily selected from one of spacer groups with a chain length of 3-30 carbon atoms, X$^5$ is arbitrarily selected from one of —COO— and —CH=CH—COO—, and F is arbitrarily selected from one of

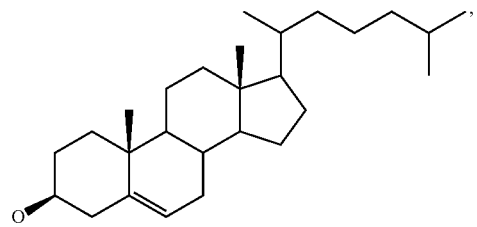
,

-continued

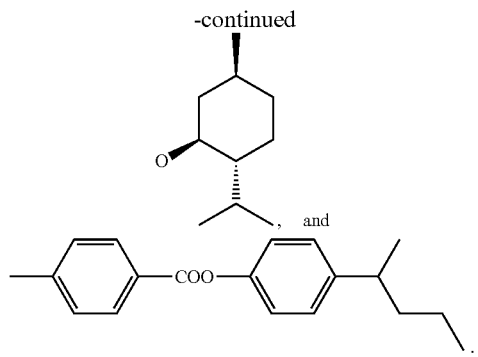
, and

.

Specifically, the chiral reagent may be selected from at least one of

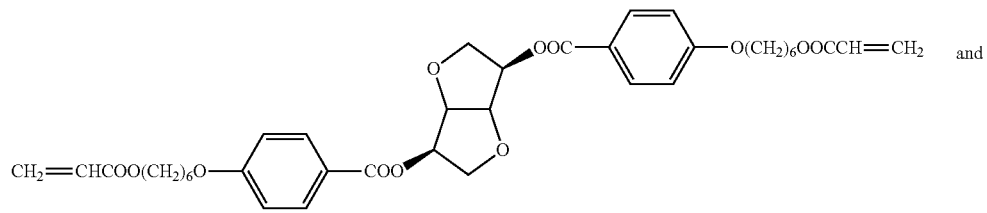

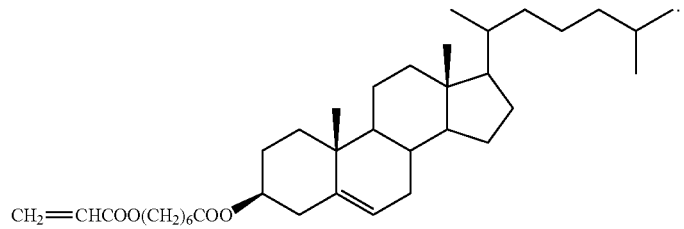

The photoinitiator may be at least one of a free radical initiator and a cationic initiators, for example, at least one of dimethoxybenzoin, 1-hydroxyketone, BDMB, phenyl bis(2,4,6-trimethylbenzoyl)-phosphine oxide, diazonium salt, diaryliodonium salt, triarylsulfonium salt, alkylsulfonium salt, iron arene salt, sulfonyloxyketone, and triarylsiloxane.

In the embodiments of the present disclosure, the organic solvent may be at least one of toluene, xylene, ethylene glycol monomethyl ether, propylene glycol monomethyl ether, ethyl acetate, n-butyl acetate, n-propyl acetate, isobutyl acetate, amyl acetate, butanone, methyl isobutyl ketone, and isophorone.

In one embodiment of the liquid crystal composition of the present disclosure, the liquid crystal composition further comprises 0.1%-1% of an antioxidant and 0.01%-0.1% of an assistant.

Specifically, the antioxidant in the embodiments of the present disclosure may be selected from any one of hydroquinone, methoxyhydroquinone, p-benzoquinone, mono-tert-butylhydroquinone, pyrocatechol, p-tert-butylpyrocatechol, benzoquinone, 2,5-di-tert-butylhydroquinone, 2,5-dimethyl-p-benzoquinone, anthraquinone, and 2,6-di-tert-butyl-p-cresol.

The assistant may be selected from at least one of a fluorocarbon surfactant or an organosilicon surfactant.

Moreover, the liquid crystal composition of the present disclosure may further comprise 0.1%-3% of a tackifier. Specifically, the material that may be used as the tackifier is at least one of the monomers, oligomers and prepolymers of acrylates, methacrylates, and epoxy acrylates having polymerizable groups.

It may be appreciated from the description of the aforesaid embodiments that, the liquid crystal composition according to the present disclosure comprises a liquid crystal monomer, a chiral reagent, a photoinitiator and a solvent. The liquid crystal composition contains no pigment particles or liquid crystal microcapsules, and after being cured exhibits visual angle dependent optical effect. Because the liquid crystal composition of the present disclosure contains no pigment particles, it is free of the phenomenon of coloring and poor discoloration effect as a result of arrangement of pigment pieces. Further, the composition contains no liquid crystal microcapsules, so after being UV cured into a film, it does not change as the external conditions (such as temperature, magnetic field and pressure) change. Thus, the liquid crystal composition of the present disclosure has excellent properties.

Additionally, the liquid crystal composition provided by the present disclosure can be used as an oil ink, a colorant or the like and can be printed onto various substrates such as glass, stainless steel, iron sheet, copper printing paper and plastics through gravure or flexo printing, so that it has a promising application prospect.

The liquid crystal composition of the present disclosure will be described through specific embodiments respectively hereinbelow. The components of the embodiments only give an example of one of the compositions, for example liquid crystal monomer, chiral reagent, photoinitiator, antioxidant, assistant and organic solvent. Other optional materials listed above are also applicable and will not be illustrated one by one in the present disclosure. For ease of description, the composition of the liquid crystal monomers in the following embodiments comprises compound 1 and compound 2, and the chiral reagent is represented by compound 3.

Example 1

In this example, compound 1 is:

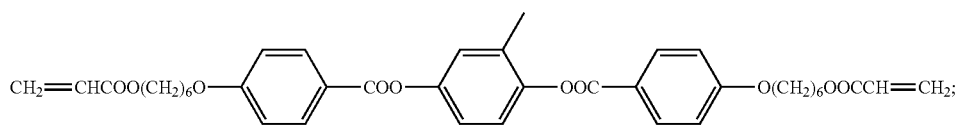

compound 2 is:

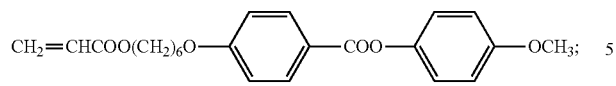

and compound 3 is

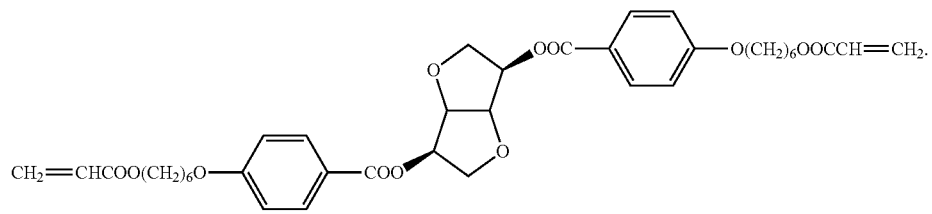

In this example, the photoinitiator adopts initiator 907 (Ciba), the antioxidant adopts antioxidant 703 (Nanjing YinQi Biology Engineering Co., Ltd.), the assistant adopts a fluorine-containing surfactant (Guangzhou Debang Chemical Co., Ltd.), and the organic reagent adopts butanone.

For the ratio between the components of this example, please refer to Table 1 below:

TABLE 1

Mass Percentages of the Components of the Liquid Crystal Composition of Example 1

| Component | Mass percentage |
|---|---|
| Compound 1 | 20.9% |
| Compound 2 | 10.46% |
| Compound 3 | 1.67% |
| Initiator 907(Ciba) | 0.67% |
| Antioxidant 703 (Nanjing YinQi Biology Engineering Co., Ltd.) | 0.17% |
| Fluorine-containing surfactant (Guangzhou Debang Chemical Co., Ltd.) | 0.03% |
| Butanone | 66.1% |

According to the aforesaid formula and amounts, compound 1, compound 2, compound 3 and butanone were placed into a stirrer where they were stirred at 50° C. for half an hour first, and then the initiator 907, the antioxidant 703 and the fluorine-containing surfactant were added thereto. The mixture was further stirred for 10 min and filtered to obtain an optically variable liquid crystal composition. This liquid crystal composition could be used as an ink for ink-jet printing. This liquid crystal composition was cured into a film on substrates such as PET, glass, stainless steel, iron sheet, OPP, PE, and copper printing paper through a UV ink-jet printer, and the resulting film looks red when viewed from the front and green from the side.

Example 2

In this example, compound 1 is:

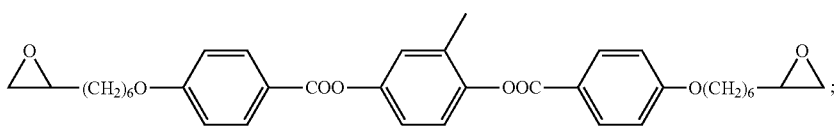

compound 2 is:

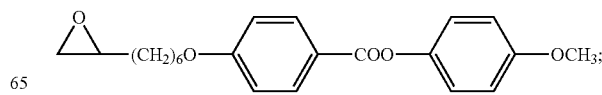

and compound 3 is

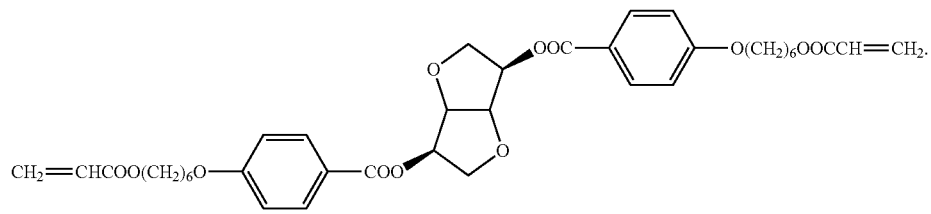

In this example, the photoinitiator adopts a cationic initiator ((phenylthio)phenyl-diphenyl sulfonium hexafluorophosphate, BASF), the antioxidant adopts antioxidant 703 (Nanjing YinQi Biology Engineering Co., Ltd.), the assistant adopts a fluorine-containing surfactant (Guangzhou Debang Chemical Co., Ltd.), and the organic reagent adopts butanone.

For the ratio between the components of this example, please refer to Table 2 below:

TABLE 2

Mass Percentages of the Components of the Liquid Crystal Composition of Example 2

| Component | Mass percentage |
|---|---|
| Compound 1 | 20.66% |
| Compound 2 | 10.33% |
| Compound 3 | 2.02% |
| Cationic initiator ((phenylthio)phenyl-diphenyl sulfonium hexafluorophosphate, BASF) | 0.82% |
| Antioxidant 703 (Nanjing YinQi Biology Engineering Co., Ltd.) | 0.12% |

TABLE 2-continued

Mass Percentages of the Components of the Liquid Crystal Composition of Example 2

| Component | Mass percentage |
|---|---|
| Fluorine-containing surfactant (Guangzhou Debang Chemical Co., Ltd.) | 0.05% |
| Butanone | 66.0% |

According to the aforesaid formula and amounts, compound 1, compound 2, compound 3 and butanone were placed into a stirrer where they were stirred at 50° C. for half an hour first, and then initiator 907, antioxidant 703 and the fluorine-containing surfactant were added thereto. The mixture was further stirred for 10 min and filtered to obtain an optically variable liquid crystal composition. The liquid crystal composition prepared in this example could be used as an ink for ink jet printing. This liquid crystal composition was cured into a film on substrates such as PET, glass, stainless steel, iron sheet, OPP, PE, and copper printing paper through a UV ink jet printer, and the resulting film looks green when viewed from the front and blue from the side.

Example 3

In this example, compound 1 is:

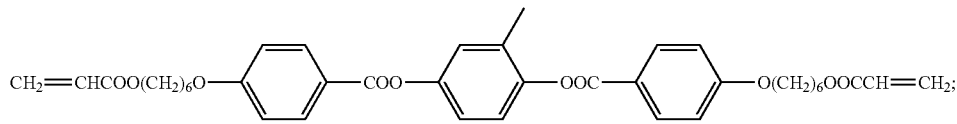

compound 2 is:

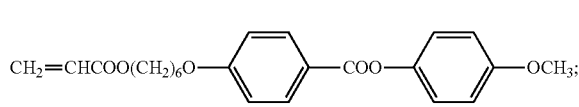

and compound 3 is

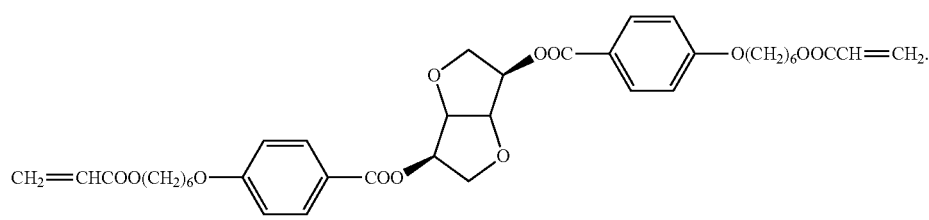

In this example, the photoinitiator adopts initiator 907 (Ciba), the antioxidant adopts antioxidant 703 (Nanjing YinQi Biology Engineering Co., Ltd.), the assistant adopts a fluorine-containing surfactant (Guangzhou Debang Chemical Co., Ltd.), and the organic reagent adopts butanone. The liquid crystal composition in this example further comprises a tackifier to increase the viscosity of the liquid crystal composition. The amount of the tackifier added could be controlled as required. In the embodiments of the present disclosure, the mass percentage of the tackifier in the composition is preferably 0.1%-1%, and further preferably 0.5%-1%, for example, 0.5%, 0.7%, 0.8% and 1%.

For the ratio between the components of this example, please refer to Table 3 below:

TABLE 3

Mass Percentages of the Components of the Liquid Crystal Composition of Example 3

| Component | Mass percentage |
| --- | --- |
| Compound 1 | 24% |
| Compound 2 | 12.53% |
| Compound 3 | 2% |
| Tackifier | 1% |
| Initiator 907(Ciba) | 0.8% |
| Antioxidant 703 (Nanjing YinQi Biology Engineering Co., Ltd.) | 0.2% |
| Fluorine-containing surfactant (Guangzhou Debang Chemical Co., Ltd.) | 0.07% |
| Butanone | 59.4% |

According to the aforesaid formula and amounts, compound 1, compound 2, compound 3, the tackifier and butanone were placed into a stirrer where they were stirred at 50° C. for half an hour first, and then initiator 907, antioxidant 703 and the fluorine-containing surfactant were added thereto. The mixture was further stirred for 10 min, and filtered to obtain a liquid crystal composition. The liquid crystal composition in this example could be used as a liquid crystal ink. This liquid crystal composition was applicable to gravure and flexo printing and UV cured into a film on substrates such as PET, glass, stainless steel, iron sheet, OPP, PE, and copper printing paper, and the resulting film looks red when viewed from the front and green from the side.

Example 4

In this example, compound 1 is:

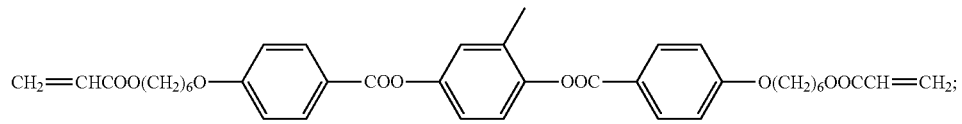

compound 2 is:

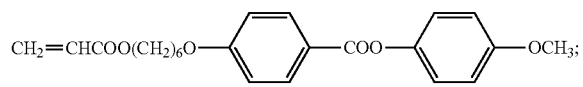

and compound 3 is

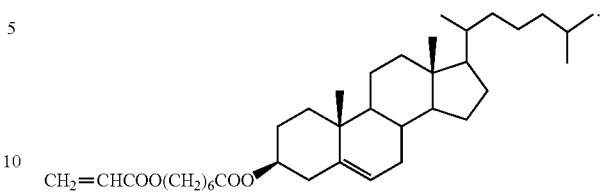

In this example, the photoinitiator adopts initiator 907 (Ciba), the antioxidant adopts antioxidant 703 (Nanjing YinQi Biology Engineering Co., Ltd.), the assistant adopts a fluorine-containing surfactant (Guangzhou Debang Chemical Co., Ltd.), and the organic reagent adopts butanone. The liquid crystal composition in this example further comprises a tackifier to increase the viscosity of the liquid crystal composition.

For the ratio between the components of this example, please refer to Table 4 below:

TABLE 4

Mass Percentages of the Components of the Liquid Crystal Composition of Example 4

| Component | Mass percentage |
| --- | --- |
| Compound 1 | 19.34% |
| Compound 2 | 11.9% |
| Compound 3 | 7.93% |
| Tackifier | 0.5% |
| Initiator 907(Ciba) | 0.16% |
| Antioxidant 703 (Nanjing YinQi Biology Engineering Co., Ltd.) | 0.63% |
| Fluorine-containing surfactant (Guangzhou Debang Chemical Co., Ltd.) | 0.04% |
| Butanone | 59.5% |

According to the aforesaid formula and amounts, compound 1, compound 2, compound 3, the tackifier and butanone were placed into a stirrer where they were stirred at 50° C. for half an hour first, and then initiator 907, antioxidant 703 and the fluorine-containing surfactant were added thereto. The mixture was further stirred for 10 min, and filtered to obtain a liquid crystal composition. The liquid crystal composition prepared in this example could be used as a liquid crystal ink. This liquid crystal composition was applicable to gravure and flexo printing and UV cured into a film on substrates such as PET, glass, stainless steel, iron sheet, OPP, PE, and copper printing paper, and the resulting film looks orange red when viewed from the front and grass green from the side.

Example 5

In this example, compound 1 is:

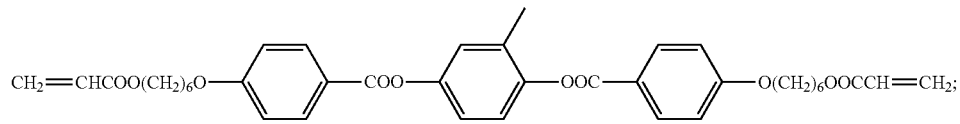

compound 2 is:

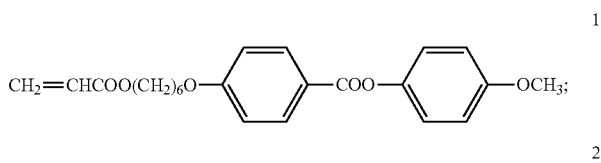

and compound 3 is

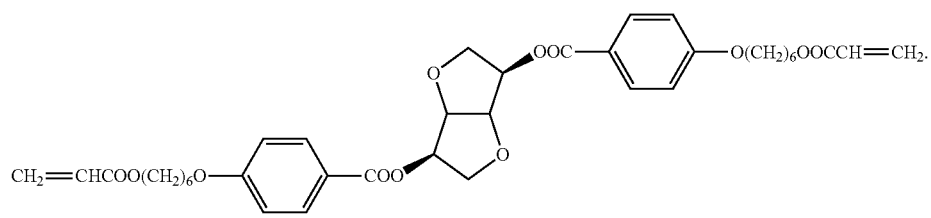

In this example, the photoinitiator adopts initiator 907 (Ciba), the antioxidant adopts antioxidant 703 (Nanjing YinQi Biology Engineering Co., Ltd.), the assistant adopts a fluorine-containing surfactant (Guangzhou Debang Chemical Co., Ltd.), and the organic reagent adopts butanone.

For the ratio between the components of this example, please refer to Table 5 below:

TABLE 5

Mass Percentages of the Components of the Liquid Crystal Composition of Example 5

| Component | Mass percentage |
|---|---|
| Compound 1 | 20.92% |
| Compound 2 | 10.46% |
| Compound 3 | 1.67% |
| Initiator 907(Ciba) | 0.67% |
| Antioxidant 703 (Nanjing YinQi Biology Engineering Co., Ltd.) | 0.16% |
| Fluorine-containing surfactant (Guangzhou Debang Chemical Co., Ltd.) | 0.02% |
| Butanone | 66.1% |

According to the aforesaid formula and amounts, compound 1, compound 2, compound 3 and butanone were placed into a stirrer where they were stirred at 50° C. for half an hour first, and then initiator 907, antioxidant 703 and the fluorine-containing surfactant were added thereto. The mixture was further stirred for 10 min, and filtered to obtain a liquid crystal composition. The liquid crystal composition prepared in this example could be used as a liquid colorant. This liquid crystal composition was applicable to substrates such as PET, glass, stainless steel, iron sheet, OPP, PE, and copper printing paper. It was UV cured into a film which looks red when viewed from the front and green from the side.

Example 6

In this example, compound 1 is:

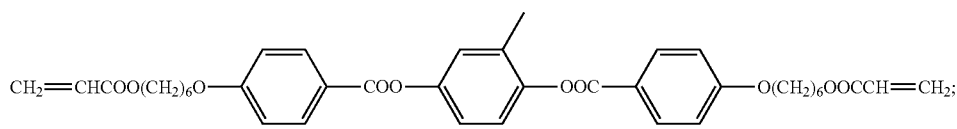

compound 2 is:

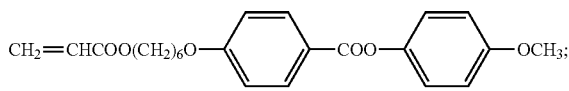

and compound 3 is

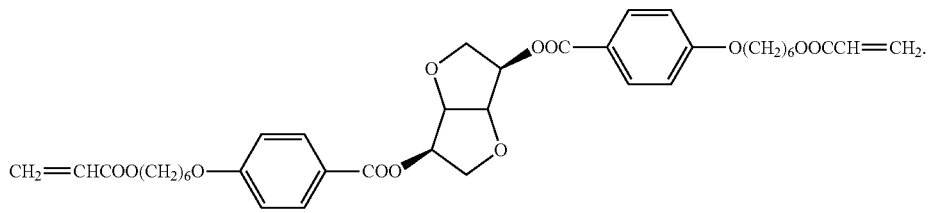

In this example, the photoinitiator adopts initiator 907 (Ciba), and the organic reagent adopts butanone.

For the ratio between the components of this example, please refer to Table 6 below:

TABLE 6

Mass Percentages of the Components of the Liquid Crystal Composition of Example 6

| Component | Mass percentage |
|---|---|
| Compound 1 | 26.3% |
| Compound 2 | 13.6% |
| Compound 3 | 2.11% |
| Initiator 907(Ciba) | 0.72% |
| Butanone | 68.3% |

According to the aforesaid formula and amounts, compound 1, compound 2, compound 3 and butanone were placed into a stirrer where they were stirred at 50° C. for half an hour first, and then initiator 907 was added thereto. The mixture was further stirred for 10 min, and filtered to obtain an optically variable liquid crystal composition. This liquid crystal composition could be used as an ink for ink jet printing, a liquid crystal ink or a liquid colorant. This liquid crystal composition was cured into a film on substrates such as PET, glass, stainless steel, iron sheet, OPP, PE, and copper printing paper through a UV ink-jet printer. The resulting film looks red when viewed from the front and green from the side.

What described above are the specific embodiments of the present disclosure and the equivalent replacements of other equivalent substances are also covered within the scope of the present disclosure.

According to the description of the aforesaid embodiments, the liquid crystal composition provided by the present disclosure may comprise a polymerizable liquid crystal monomer, a chiral reagent, a photoinitiator and a solvent. This liquid crystal composition contains no pigment particles or liquid crystal microcapsules, and after being cured exhibits visual angle dependent optical effect. Because the liquid crystal composition of the present disclosure contains no pigment particles, it is free of the phenomenon of coloring and poor discoloration effect as a result of arrangement of pigment pieces. Further, the composition contains no liquid crystal microcapsules, so after being UV cured into a film, it does not change as the external conditions (such as temperature, magnetic field and pressure) change. Thus, the liquid crystal composition of the present disclosure has excellent properties.

Additionally, the liquid crystal composition provided by the present disclosure can be used as an oil ink, a colorant or the like and can be printed onto various substrates such as glass, stainless steel, iron sheet, copper printing paper and plastics through gravure or flexo printing, so that it has a promising application prospect.

What described above are only the embodiments of the present disclosure, but are not intended to limit the scope of the present disclosure. Any equivalent structures or equivalent process flow modifications that are made according to the specification of the present disclosure, or any direct or indirect applications of the present disclosure in other related technical fields shall all be covered within the scope of the present disclosure.

What is claimed is:

1. A liquid crystal composition, comprising the following components in their respective mass percentages:
   8%-50% of a polymerizable liquid crystal monomer;
   1%-30% of a chiral reagent;
   0.1%-5% of a photoinitiator; and
   30%-59.5% of an organic solvent;
   wherein the liquid crystal composition comprises no pigment particles or liquid crystal microcapsules.

2. The composition of claim 1, wherein the liquid crystal composition comprises the following components in their respective mass percentages:
   30%-40% of a polymerizable liquid crystal monomer;
   1%-8% of a chiral reagent;
   0.1%-0.8% of a photoinitiator; and
   50%-59.5% of an organic solvent.

3. The composition of claim 1, wherein,
   the polymerizable liquid crystal monomer comprises at least one of mono-functional liquid crystal monomers and bi-functional liquid crystal monomers;
   the chiral reagent is at least one of acrylates, methacrylates, epoxy reins, methyl epoxy resins and alkenes containing cholesterol, menthol and isosorbitol chiral groups or chiral centers; and
   the photoinitiator is at least one of a free radical initiator and a cationic initiator.

4. The composition of claim 3, wherein the structural formula of the mono-functional liquid crystal monomer is P-Sp-X-M-R, wherein P is arbitrarily selected from one of CH$_2$=CW—COO—, WCH=CH—O—, and

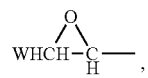

W is arbitrarily selected from one of H, —CH$_3$, and Cl, Sp is arbitrarily selected from one of spacer groups with a chain length of 3-30 carbon atoms, X is arbitrarily selected from one of —O—, —S—, —CO—, —COO—, —OCO—, —CO—NH—, —NH—CO—, —CH$_2$CH$_2$—, —OCH$_2$—, —CH$_2$O—, —SCH$_2$—, —CH$_2$S—, —CH═CH— and —CH═CH—COO—, M is a mesogenic group, and R is arbitrarily selected from H, CN, Cl, alkoxyl, straight-chain alkanes, branched alkanes and cycloalkanes;

wherein, the structural formula of the mesogenic group M is -A$^1$-Z$^1$-(A$^2$-Z$^2$)$_m$-A$^3$-, Z$^1$ and Z$^2$ are each independently selected from one of —COO—, —OCO—, —CH$_2$CH$_2$—, —OCH$_2$—, —CH$_2$O—, —CH═CH—, —CH═CH—COO—, —OCO—CH═CH— and —C≡C—, m is 0, 1, or 2, A$^1$, A$^2$, and A$^3$ are each independently selected from one of

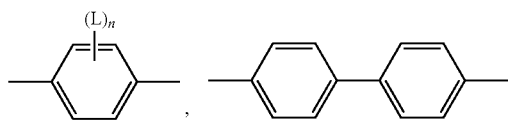

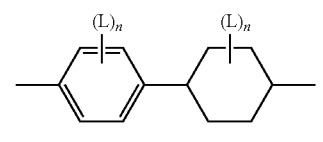

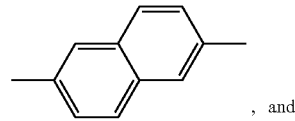, and

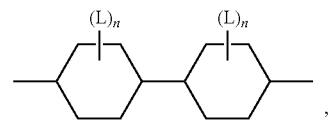

L is arbitrarily selected from one of H, F, Cl, CN, OH, NO$_2$, CH$_3$, C$_2$H$_5$, OCH$_3$, OC$_2$H$_5$, COCH$_3$, COOCH$_3$, COOC$_2$H$_5$, CF$_3$, OCF$_2$, and OC$_2$F$_5$, and n is 0, 1, or 2.

5. The composition of claim 3, wherein the structural formula of the bi-functional liquid crystal monomer is P$^1$-Sp$^1$-X$^1$—Y—X$^2$-Sp$^2$-P$^2$, wherein P$^1$ and P$^2$ are arbitrarily selected from one of CH$_2$═CW—COO—, WCH═CH—O—, and

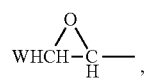,

W is arbitrarily selected from one of H, —CH$_3$ and Cl, Sp$^1$ and Sp$^2$ are arbitrarily selected from one of spacer groups with a chain length of 3-30 carbon atoms, X$^1$ and X$^2$ are each arbitrarily selected from one of —O—, —S—, —CO—, —COO—, —OCO—, —CO—NH—, —NH—CO—, —CH$_2$CH$_2$—, —OCH$_2$—, —CH$_2$O—, —SCH$_2$—, —CH$_2$S—, —CH═CH— and —CH═CH—COO—, Y is a mesogenic group, the structural formula of the mesogenic group Y is -A$^4$-Z$^3$-(A$^5$-Z$^4$)$_m$-A$^6$-, Z$^3$ and Z$^4$ are each independently selected from one of —COO—, —OCO—, —CH$_2$CH$_2$—, —OCH$_2$—, —CH$_2$O—, —CH═CH—, —CH═CH—COO—, —OCO—CH═CH— and —C≡C—, m is 0, 1, or 2, A$^4$, A$^5$, and A$^6$ are each independently selected from one of

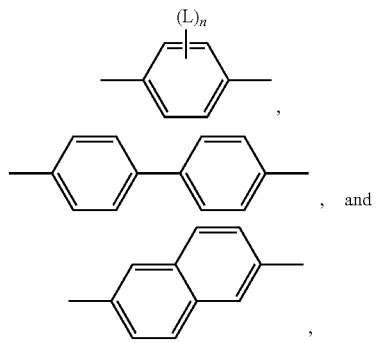, and

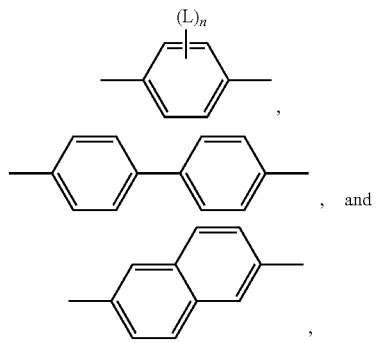,

L is arbitrarily selected from one of H, F, Cl, CN, OH, NO$_2$, CH$_3$, C$_2$H$_5$, OCH$_3$, OC$_2$H$_5$, COCH$_3$, COOCH$_3$, COOC$_2$H$_5$, CF$_3$, OCF$_2$, and OC$_2$F$_5$, and n is 0, 1, or 2.

6. The composition of claim 3, wherein the structure formula of the chiral reagent is P$^3$—Sp$^3$-X$^3$-G-X$^4$-Sp$^4$-P$^4$ or P$^5$—Sp$^5$-X$^5$—F, wherein P$^3$ and P$^4$ are each independently selected from one of CH$_2$═CW—COO—, WCH═CH—O— and

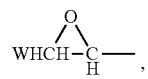,

W is arbitrarily selected from one of H, —CH$_3$ and Cl, Sp$^3$ and Sp$^4$ are each arbitrarily selected from one of spacer groups with a chain length of 3-30 carbon atoms, X$^3$ and X$^4$ are each independently selected from one of —O—, —S—, —CO—, —COO—, —OCO—, —CO—NH—, —NH—CO—, —CH$_2$CH$_2$—, —OCH$_2$—, —CH$_2$O—, —SCH$_2$—, —CH$_2$S—, —CH═CH—, and —CH═CH—OCO—, G is arbitrarily selected from one of

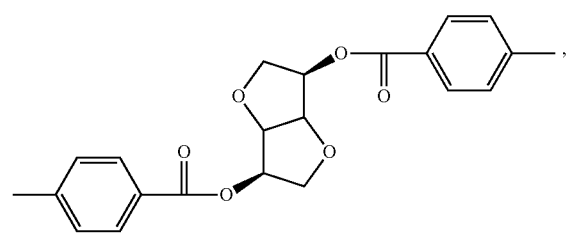

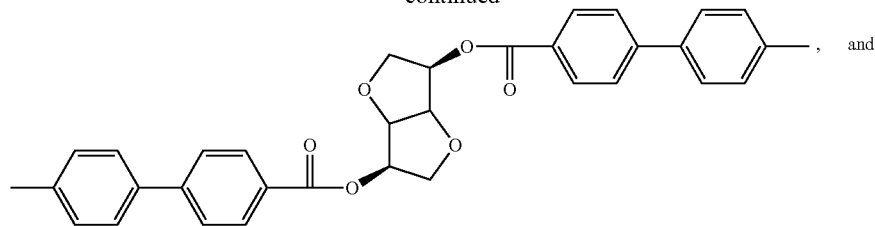

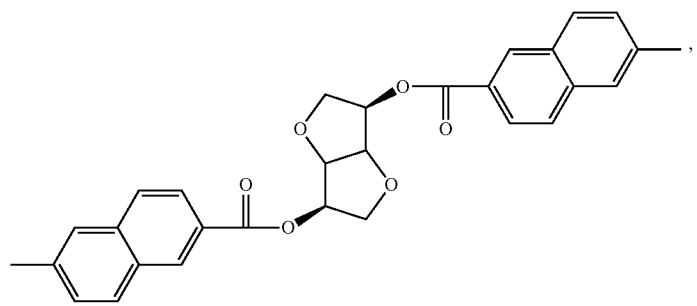

P⁵ is arbitrarily selected from one of CH$_2$=CW—COO—, WCH=CH—O— and

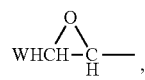

W is arbitrarily selected from one of H, —CH$_3$ and Cl, Sp⁵ is arbitrarily selected from one of spacer groups with a chain length of 3-30 carbon atoms, X⁵ is arbitrarily selected from one of —COO— and —CH=CH—COO—, and F is arbitrarily selected from one of

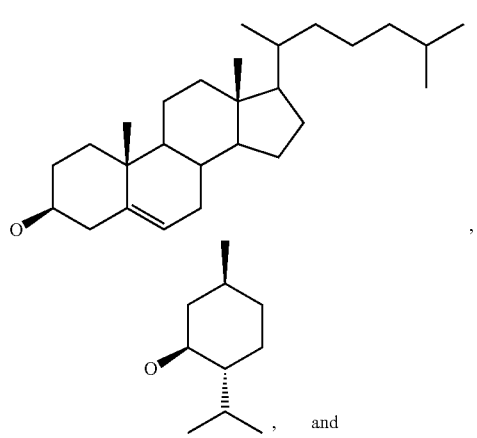

-continued

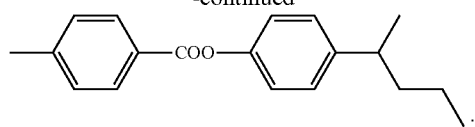

7. The composition of claim 4, wherein the mono-functional liquid crystal monomer is at least one of

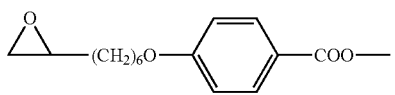

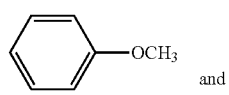

8. The composition of claim 5, wherein the bi-functional liquid crystal monomer is at least one of

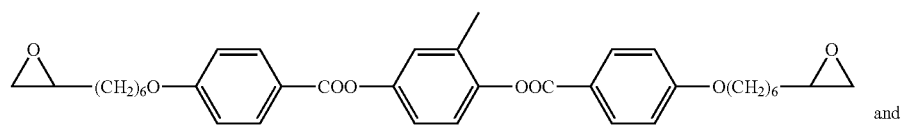

-continued

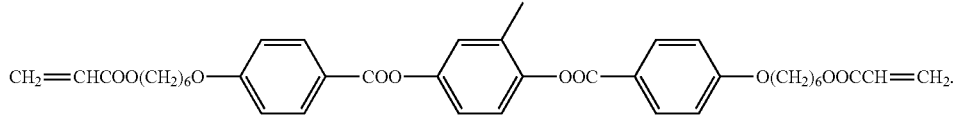

9. The composition of claim 6, wherein the chiral reagent is at least one of

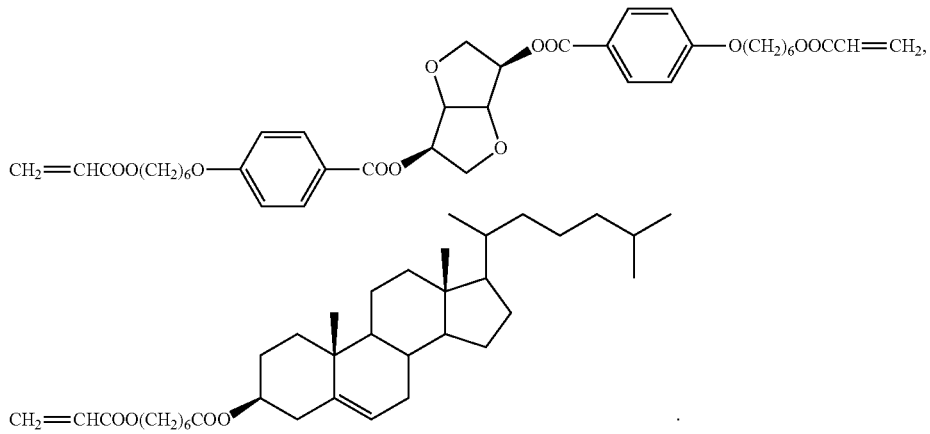

10. The composition of claim 1, wherein the composition further comprises 0.1%-1% of an antioxidant and 0.01%-0.1% of an assistant, wherein the antioxidant is any one of hydroquinone, methoxyhydroquinone, p-benzoquinone, mono-tert-butylhydroquinone, pyrocatechol, p-tert-butylpyrocatechol, benzoquinone, 2,5-di-tert-butylhydroquinone, 2,5-dimethyl-p-benzoquinone, anthraquinone, and 2,6-di-tert-butyl-p-cresol; and the assistant is at least one of a fluorocarbon surfactant or an organosilicon surfactant.

11. The composition of claim 10, wherein the composition further comprises 0.1%-1% of a tackifier which is at least one of the monomers, oligomers and prepolymers of acrylates, methacrylates, and epoxy acrylates having polymerizable groups.

12. The composition of claim 1, wherein the photoinitiator is at least one of dimethoxybenzoin, 1-hydroxyketone, BDMB, phenyl bis(2,4,6-trimethylbenzoyl)-phosphine oxide, diazonium salt, diaryliodonium salt, triarylsulfonium salt, alkylsulfonium salt, iron arene salt, sulfonyloxyketone, and triarylsiloxane.

13. The composition of claim 1, wherein the organic solvent is at least one of toluene, xylene, ethylene glycol monomethyl ether, propylene glycol monomethyl ether, ethyl acetate, n-butyl acetate, n-propyl acetate, iso-butyl acetate, amyl acetate, butanone, methyl isobutyl ketone, and isophorone.

* * * * *